(12) United States Patent
Levinski

(10) Patent No.: US 10,761,023 B2
(45) Date of Patent: Sep. 1, 2020

(54) DIFFRACTION-BASED FOCUS METROLOGY

(71) Applicant: KLA-Tencor Corporation, Milpitas, CA (US)

(72) Inventor: Vladimir Levinski, Migdal HaEmek (IL)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 15/566,868

(22) PCT Filed: Jun. 2, 2017

(86) PCT No.: PCT/US2017/035821
§ 371 (c)(1),
(2) Date: Oct. 16, 2017

(87) PCT Pub. No.: WO2018/071063
PCT Pub. Date: Apr. 19, 2018

(65) Prior Publication Data
US 2019/0049373 A1 Feb. 14, 2019

Related U.S. Application Data

(60) Provisional application No. 62/408,238, filed on Oct. 14, 2016.

(51) Int. Cl.
*G01N 21/47* (2006.01)
*G03F 1/44* (2012.01)
(Continued)

(52) U.S. Cl.
CPC ....... *G01N 21/4788* (2013.01); *G01N 21/956* (2013.01); *G03F 1/44* (2013.01);
(Continued)

(58) Field of Classification Search
CPC .......... G03F 1/44; G03F 7/70641; G01N 2021/95676; G01N 21/4788; G01N 21/956; H01L 22/12
(Continued)

(56) References Cited

U.S. PATENT DOCUMENTS 7,916,284 B2 3/2011 Dusa et al.
2002/0021434 A1 2/2002 Nomura et al.
(Continued)

FOREIGN PATENT DOCUMENTS

WO 2015062854 A1 5/2015
WO 2015090839 A1 6/2015
(Continued)

OTHER PUBLICATIONS

ISA/KR, International Search Report for PCT/US2017/035821 dated Sep. 19, 2017.
(Continued)

*Primary Examiner* — Tri T Ton
(74) *Attorney, Agent, or Firm* — Hodgson Russ LLP

(57) ABSTRACT

Diffraction-based focus target cells, targets and design and measurement methods are provided, which enable sensitive focus measurements to be carried out by overlay measurement tools. Cells comprise a periodic structure having a coarse pitch and multiple elements arranged at a fine pitch. The coarse pitch is an integer multiple of the fine pitch, with the fine pitch being between one and two design rule pitches and smaller than a measurement resolution and the coarse pitch being larger than the measurement resolution. The elements are asymmetric to provide different amplitudes in $+1^{st}$ and $-1^{st}$ diffraction orders of scattered illumination, and a subset of the elements has a CD (critical dimension) larger than a printability threshold and the other elements have a CD smaller than the printability threshold.

13 Claims, 5 Drawing Sheets

(51) Int. Cl.
*G03F 7/20* (2006.01)
*G01N 21/956* (2006.01)
*H01L 21/66* (2006.01)

(52) U.S. Cl.
CPC .......... *G03F 7/70641* (2013.01); *H01L 22/12* (2013.01); *G01N 2021/95676* (2013.01)

(58) Field of Classification Search
USPC ........ 356/335–343, 300–334, 488–499, 521, 356/902, 957, FOR. 116
See application file for complete search history.

(56) References Cited

U.S. PATENT DOCUMENTS

| | | |
|---|---|---|
| 2007/0108368 A1 | 5/2007 | Mieher et al. |
| 2014/0065736 A1 | 3/2014 | Amir et al. |
| 2014/0141536 A1 | 5/2014 | Levinski et al. |
| 2016/0274456 A1 | 9/2016 | Chen et al. |
| 2016/0313656 A1 | 10/2016 | Van Dommelen et al. |

FOREIGN PATENT DOCUMENTS

| | | |
|---|---|---|
| WO | 2015175425 A1 | 11/2015 |
| WO | 2016123552 A1 | 8/2016 |

OTHER PUBLICATIONS

Brunner & Ausschnitt, Process Monitor Gratings, SPIT, vol. 6518, 651803-1 to 651803-9, 2007.

Ausschnitt & Lagus, Seeing the Forest for the Trees: A New Approach to CD Control, SPIE, vol. 3332, pp. 212-220, 1998.

Brunner et al., Quantitative Stepper Metrology Using the Focus Monitor Test Mask, SPIT, vol. 2197, pp. 541-549, 1994.

Hinnen et al., Scatterometry-Based On-Product Focus Measurement and Monitoring, Advanced Semiconductor Manufacturing Conference 2013, IEEE, pp. 352-359, 2013.

Lee et al., "Highly sensitive focus monitoring technique based on illumination and target co-optimization", Proceedings of SPIE, Metrology, Inspection, and Process Control for Microlithography, 2016, 977826, vol. 9778.

EPO, EESR for EP 17860979.8, Mar. 18, 2020.

DIFFRACTION-BASED FOCUS METROLOGY

CROSS REFERENCE TO RELATED APPLICATIONS

This application claims the benefit of U.S. Provisional Patent Application No. 62/408,238 filed on Oct. 14, 2016, which is incorporated herein by reference in its entirety.

BACKGROUND OF THE INVENTION

1. Technical Field

The present invention relates to the field of metrology, and more particularly, to scatterometry focus measurements and corresponding target designs.

2. Discussion of Related Art

Lithographic printing tools, e.g., scanners or steppers, are required to have focus and dose values within a specified node-defined process window, resulting in strict requirements on these parameters. For recent nodes the allowed range of focus variations is ±10 nm with respect to the nominal position of the focus and dose, becoming smaller for the next nodes. In current practice, a special test wafer (FEM, focus exposure matrix, wafer) having the same pattern is printed for different predefined scanner focus and dose values, is used to determine actual focus and dose parameters by comparison thereto.

Examples for current focus/dose measurement methods include (i) using FEM wafers with patterns of isolated lines, possibly with assist features for sensitivity enhancement (e.g., Brunner and Ausschnitt 2007, "Process Monitor Gratings" Proc. of SPIE Vol. 6518; U.S. Pat. No. 7,916,284, included herein in their entirety), (ii) measurement of line end shortening effect by an imaging tool (e.g., Ausschnitt and Lagus 1998, "Seeing the forest for the trees: a new approach to CD control", SPIE Vol. 3332, included herein in its entirety), (iii) Using of phase shift masks in specialized reticles (e.g., Brunner et al., 1994, "Quantitative stepper metrology using the focus monitor test mask", Proc. of SPIE, Vol. 2197, included herein in its entirety), and (iv) using of a focus test mask comprising an asymmetrical diffraction grating pattern and a reference pattern, which are compared with respect to shifts in the image of the grating (Hinnen et al. 2013, "Scatterometry-based on-product focus measurement and monitoring", ASMC 2013 SEMI Advanced Semiconductor Manufacturing Conference, included herein in its entirety).

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a diffraction-based focus target cell comprising a periodic structure have a coarse pitch and a plurality of elements arranged at a fine pitch, wherein the coarse pitch is an integer multiple of the fine pitch, with the fine pitch being between one and two design rule pitches and smaller than a measurement resolution and the coarse pitch being larger than the measurement resolution, wherein the elements are asymmetric to provide different amplitudes in $+1^{st}$ and $-1^{st}$ diffraction orders of scattered illumination, and wherein a subset of the elements has a CD (critical dimension) larger than a printability threshold and the other elements have a CD smaller than the printability threshold.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
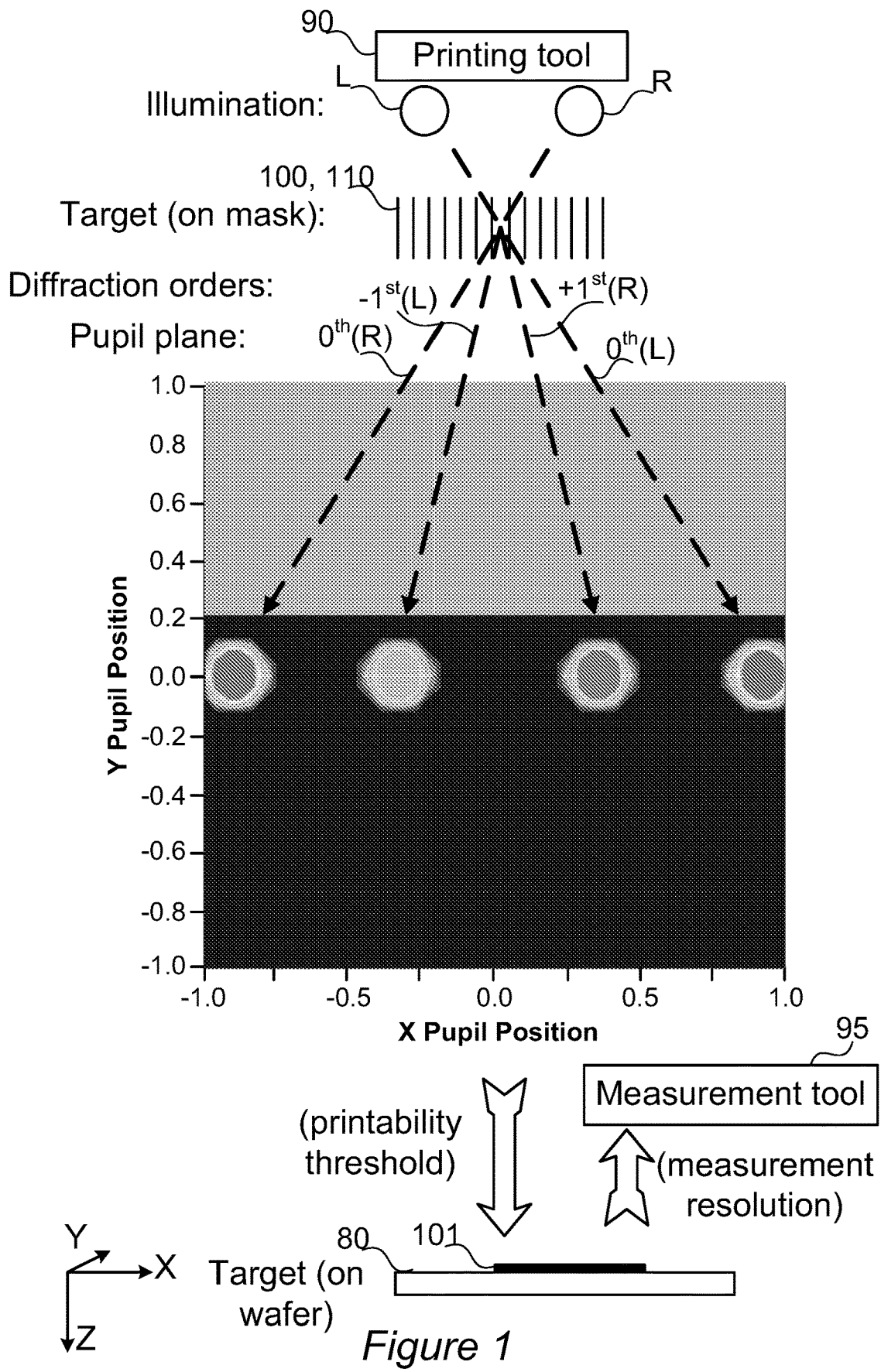
FIG. 1 is a high level schematic illustration of a general illumination and scattering scheme, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for measuring focus in scatterometry measurements and thereby provide improvements to the technological field of metrology. Diffraction-based focus target cells, targets and design and measurement methods are provided, which enable sensitive focus measurements to be carried out by overlay measurement tools. Cells comprise a periodic structure having a coarse pitch and multiple elements arranged at a fine pitch. The coarse pitch is an integer multiple of the fine pitch, with the fine pitch being between one and two design rule pitches and smaller than a measurement resolution and the coarse pitch being larger than the measurement resolution. The elements are asymmetric to provide different amplitudes in +1st and −1st diffraction orders of scattered illumination, and a subset of the elements has a CD (critical dimension) larger than a printability threshold and the other elements have a CD smaller than the printability threshold.

FIG. 1 is a high level schematic illustration of a general illumination and scattering scheme, according to some embodiments of the invention. Taking as a non-limiting example a printing tool 90 having a dipole illumination with two illumination sources denoted L and R, a diffractive target 100 (on the mask) at pitch ranges between a minimal design rule pitch (in a non-limiting example, 150 nm) and two times the minimal design rule pitch (e.g., 300 nm) delivers illumination spots at the pupil plane which correspond to $0^{th}$ and $-1^{st}$ diffraction orders from the L illumination source (denoted $0^{th}(L)$ and $-1^{st}(L)$, respectively) and illumination spots at the pupil plane which correspond to $0^{th}$ and $+1^{st}$ diffraction orders from the R illumination source (denoted $0^{th}(R)$ and $+1^{st}(R)$, respectively). It is noted that target 100 may be designed to satisfy a two-beam imaging illumination condition, as explained below. Target elements 101 are printed on a wafer 80 according to their dimensions with respect to a printability threshold, and are measured by a measurement tool 95 (e.g., a metrology overlay scatterometry tool) with respect to a measurement resolution thereof. Target elements 101 are printed along the X and Y axes, and extend into the resist layer, defined as the Z axis. It is noted that minimal design rule pitches may be different with respect to different printing tools, and may get smaller as technology advances. For example, minimal design rule pitches may be larger than 150 nm, e.g., 200 nm, 250 nm etc., or eventually smaller than 150 nm, e.g., 120 nm, 100 nm, 80 nm or even smaller. Respectively, the pitch ranges (and fine pitches disclosed below) may be larger or smaller, typically, but non-limiting, between one and two times the respective minimal design rule pitch.

For example, the image in FIG. 1 illustrates the light distribution in the illumination pupil for a minimal design rule pitch (equivalent to the printability threshold) is 90 nm and the grating pitch on the mask is 150 nm (equivalent to the fine pitch disclosed below). The two-beam imaging illumination condition is satisfied e.g., for a range of pitches (termed fine pitch below) between the minimal design rule pitch and up to almost twice the minimal design rule pitch—and the resulting image projected on wafer 80 is formed as an interference between zero ($0^{th}(R)$) and +1 ($+1^{st}(R)$) diffraction orders for the right illumination pole (R) and as an interference between zero ($0^{th}(L)$) and −1 ($-1^{st}(L)$) diffraction orders for the left illumination pole (L). In the following, disclosed target designs are asymmetric to make the amplitudes of +1 and −1 diffraction orders not equal. For example, the inventors have found out that sensitivity to focus may be enhanced by making the amplitude of one of the first diffraction orders much larger than the amplitude of the other (e.g., making the amplitude of +1 diffraction order much larger than amplitude of the −1 diffraction order), possibly to neglect the contribution of the smaller amplitude into image construction (e.g., −1 diffraction order in the example).

Certain embodiments comprise metrology focus measurement signal derived from targets 100 and/or cells 110. Certain embodiments comprise target design files of targets 100 and/or targets composed of cells 110.

Figure 2:
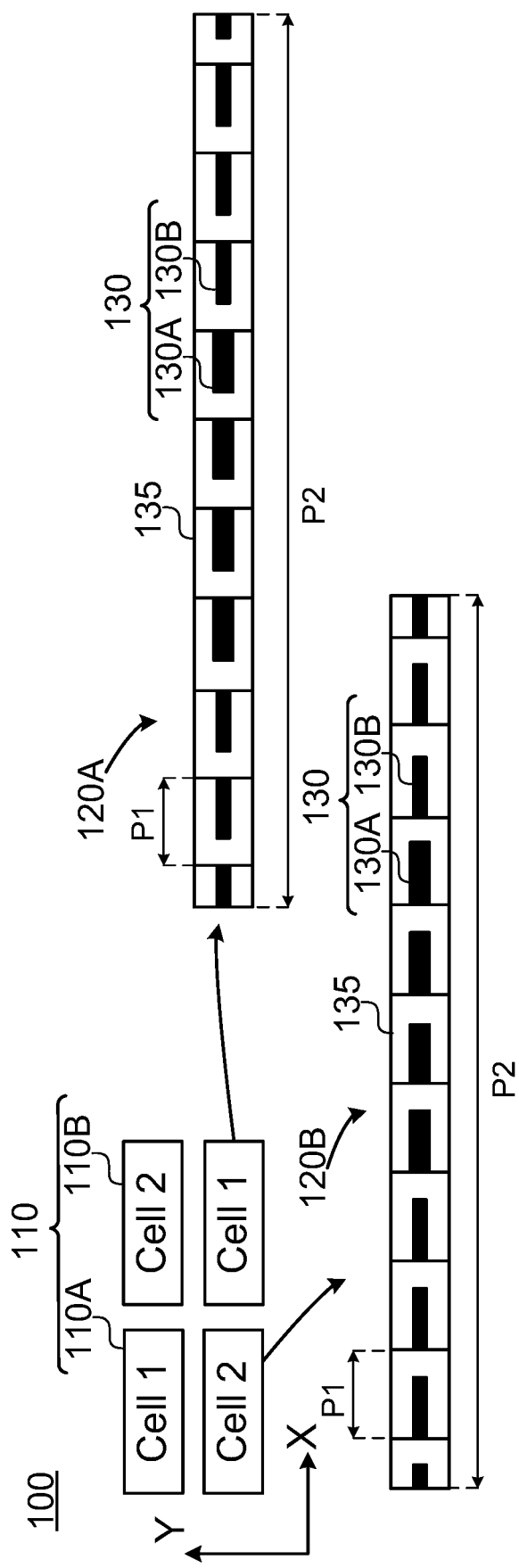
FIG. 2 is a high level schematic illustration of a diffraction-based focus target, according to some embodiments of the invention.

FIG. 2 is a high level schematic illustration of a diffraction-based focus target 100, according to some embodiments of the invention. Diffraction-based focus target 100 comprises multiple diffraction-based focus target cells 110 (e.g., 110A, 110B) having at least two pairs of cells 110 (indicated schematically as Cell 1 and Cell 2) with opposite asymmetry of elements 130 in cells 110, so that target 100 has a 180° rotational symmetry. It is noted that FIG. 2 illustrates cell and target designs on the mask (see also FIG. 1), and that these designs are not fully printed on wafer 80, as explained below.

Diffraction-based focus target cells 110 comprise periodic structures with a coarse pitch P2 (one coarse pitch structure 120A, 120B are shown for each cell 110A, 110B, respectively) and multiple elements 130 arranged at a fine pitch P1. The fine pitch P1 may be selected to satisfy the two-beam imaging illumination condition, e.g., being between one and two design rule pitches. Coarse pitch P2 is configured to be an integer multiple of fine pitch P1 (e.g., x10 as illustrated or any other value between x6 and x20—as non-limiting examples). Fine pitch P1 may be selected to be unresolved by the measurement tool (e.g., P1<2 times the minimal design rule pitch, e.g., P1<2·150 nm as typical, non-limiting minimal design rule pitch) and coarse pitch P2 being larger than the measurement resolution. Examples for fine pitches P1 comprise e.g., 100 nm, 150 nm, 200 nm, and examples for coarse pitches P2 comprise e.g., pitches between 1000-2500 nm, as long as P2=n·P1 for some integer n.

The fine pitch P1 may be selected to satisfy the two-beam imaging illumination condition, and moreover, to have asymmetric structure(s) configured to provide an enhanced or a maximal difference between amplitudes of the respective ±1 diffraction orders (see also Equation 1 and FIG. 4 below).

Elements 130 are asymmetric (e.g., to the right or to the left of the unit cell of fine pitch P1, as illustrated in structures 120A, 120B, respectively, as non-limiting examples) to provide different amplitudes in $+1^{st}$ and $-1^{st}$ diffraction orders of scattered illumination. Noting the general illumination and scattering scheme of FIG. 1, the asymmetric design may be configured to strongly differentiate between the different diffraction orders and illumination elements.

In certain embodiments, a subset 130A of elements 130 (wider elements 130) has a CD (critical dimension) larger than a printability threshold and other elements 130B (narrower elements 130) have a CD smaller than the printability threshold. In certain embodiments, printable elements 130A may have a similar form as non-printable elements 130B as, advantageously, preserving the same form in non-printed elements 130B as the form of printed elements 130A provides the maximum closeness to the two-beam imaging condition (see, e.g., FIG. 4), making the amplitudes of all diffraction orders small apart from the zero and first diffraction orders corresponding to the P1 pitch.

In the following, an analysis of the signals illustrates the efficiency and results of using disclosed targets 100 and cells 110. Treating the illumination poles (R, L in FIG. 1), for simplicity in a non-limiting manner, as point light sources located at the centers of the illumination poles—the aerial image of targets 100 and cells 110 which are asymmetric as described above, may be expressed as in Equation 1, with I representing the intensity of the aerial image, A, B being constants and P being the fine pitch P1.

$$I = A + B \cdot \cos\left[\Phi + 2\pi W_s + \alpha(z - Z_F) + \frac{2\pi}{P}x + 2\pi W_a\right] \quad \text{Equation 1}$$

$W_s$ denotes the difference between symmetric aberrations in pupil points corresponding to the zero and +1 diffraction orders, $W_a$ denotes the difference between anti-symmetric aberrations in pupil points corresponding to the zero and +1 diffraction orders, $\Phi$ denotes the phase difference between zero and +1 diffraction orders provided by a specific choice of the mask structure (in target 100) and $\alpha \cdot (z-Z_F)$ denotes the phase shift between zero and +1 diffraction orders caused by focus shift from the focus position of printing tool 90 (e.g., a scanner).

$$\alpha = \frac{2\pi}{\lambda}[\cos\theta_0 - \cos\theta_1],$$

where $\theta_0$ and $\theta_1$ denote polar angles of the illumination plane waves corresponding to zero and first diffraction orders.

The inventors point out that approximating illumination source in the point-like illumination source framework, the parameters $\alpha$, $W_s$ and $W_a$ depend only on location of the centers of the illumination poles (L, R in FIG. 1) and on the chosen value of the fine pitch (P1)—and therefore the effect of aberrations and specific target design parameters can be separated from the focus effect of printing tool 90, and be calibrated out using a FEM wafer. As illustrated in Equation 1, the change of focus position of printing tool 90 leads to a lateral displacement of target 100 (and/or cell 110), which can be measured with measurement tool 95 such as a standard imaging overlay tool, as exemplified below.

Clearly, similar considerations are applicable to more realistic illumination sources, including ones other than dipoles, e.g., quadrupole illumination.

Disclosed cells 110 and targets 100 mimic overlay targets and be organized similarly to be invariant with respect to a 180° rotation to allow cleaning out tool induced errors of measurement tool 95 and/or printing tool 90 during measurement processing. As a non-limiting example, the arrangement illustrated in FIG. 2 comprises four cells 110, in pairs having opposite fine structure asymmetry directions (as explained above)—to yield target 100 which is invariant with respect to 180° rotation of target 100.

Figure 3:
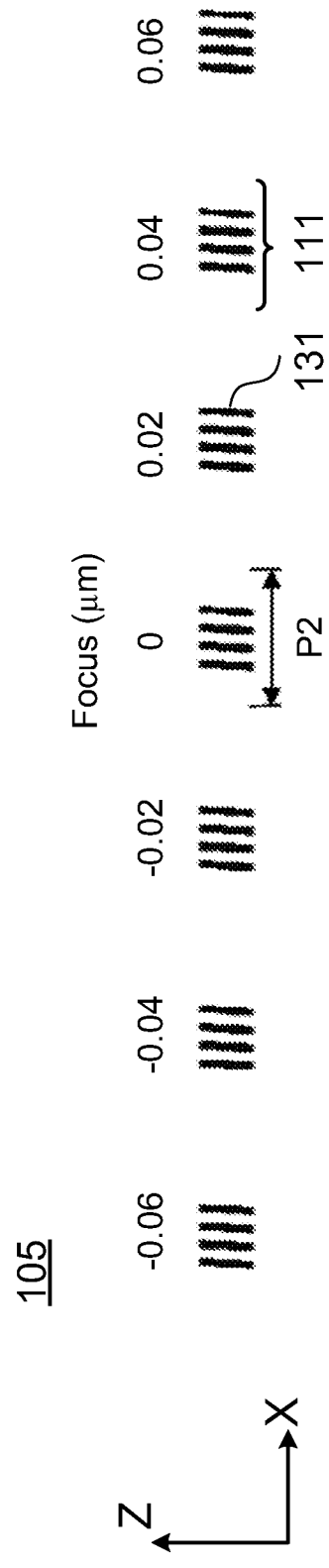
FIG. 3 is a non-limiting example for printed cells under varying focus conditions, according to some embodiments of the invention.

FIG. 3 is a non-limiting example for printed cells 111 under varying focus conditions, according to some embodiments of the invention. The inventors note that lines 131 of each printed cell 111 correspond to elements 130A which have a CD larger than the printability threshold in cells 110, and different printed cells 111 correspond to different scanner focus positions in 20 nm intervals between −60 nm and +60 nm, based on simulation with a quadrupole illumination scheme. Printed lines 131 are shown in the XZ plane, elongated in the vertical direction, within the resist layer. Printed lines 131 are also inclined since, due to target asymmetry, the position of the center of each line 131 depends on the focus position—when the Z coordinate is changed, the X coordinate is also changed. Disclosed designs are therefore able to provide horizontal shift of printed target 111 as a function of the scanner focus, without changing the form of printed pattern 111 with changing scanner focus. As a result, targets 100 are designed to provide pure shifts (without form change) which simplifies the calibration procedure with the FEM wafer significantly with respect to the prior art. The printed patterns are for different FIG. 3 illustrates the applicability of the design principles disclosed above. The effect of different focus on printed cells 111 is further illustrated in FIG. 5 below.

As illustrated in FIG. 3, each printed cell 111 only has four lines, which are printed from the ten fine pitch structures in cell 110 on mask (illustrated in FIG. 2). As a result, printed target 105 appears as a standard segmented OVL target with resolved coarse pitch P2, apart from the fact that printed lines 131 are inclined—which is due to the strong dependence of the center of each slice position on the focus. Nevertheless, printed pattern 105 holds the same form for different scanner focus positions and the effect of scanner focus changes represents itself in a lateral displacement of the printed pattern. The value of lateral displacement as function of scanner focus position is presented in FIG. 5.

It is noted that the difference in element width (CD) between elements 130A, 130B (elements 130B being designed with a slightly reduced line width which brings them below the printability threshold) provides a sharp boundary between printed lines and non-printed lines, due to small change of CD in the example. The sharp boundary enables printing contrast and process compatible target 100, with the pattern placement close to a pattern placement of target periodic with the fine pitch period, and can be seen as an overlay proxy target, in which the overlay shift between two cells 110 becomes measurable even as the fine pitch is unresolved by measurement tool 95.

Figure 4:
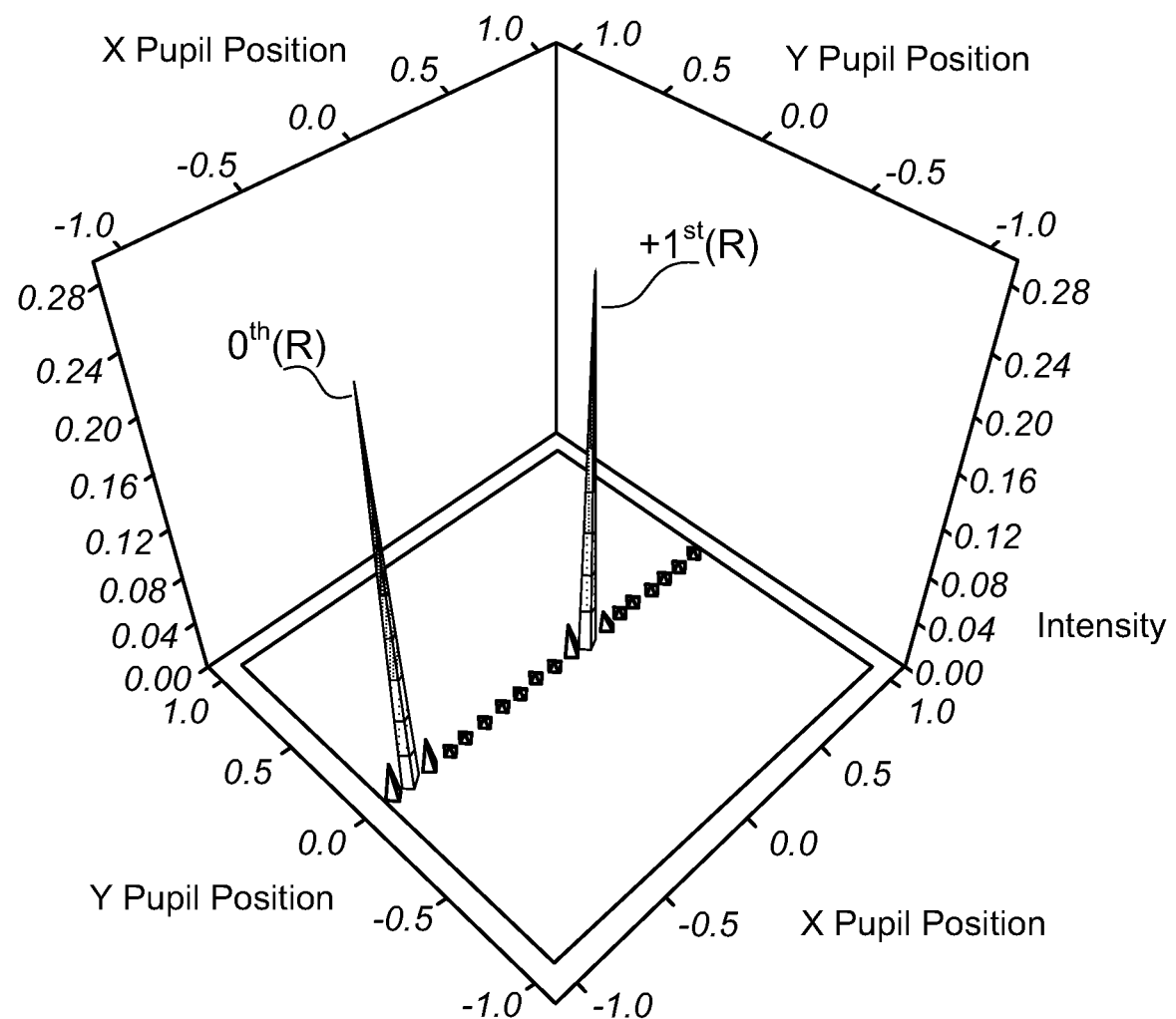
FIG. 4 is a non-limiting example for a diffraction pattern corresponding to the right illumination pole, according to some embodiments of the invention.

FIG. 4 is a non-limiting example for a diffraction pattern corresponding to the right illumination pole (R), according to some embodiments of the invention. FIG. 4 exemplifies the correctness of the considerations presented above concerning Equation 1 and the target design presented in FIG. 2, using simulation tools. As illustrated in FIG. 4, the amplitudes of all diffraction orders are small except of the $0^{th}$ ($0^{th}$(R)) and +1 ($1^{st}$(R)) diffraction orders corresponding to the fine pitch (see FIG. 1 for the notation). Correspondingly, FIG. 4 illustrates that the effect of scanner aberrations on placement of the printed target is the same as for a periodical row of fine pitch structures.

Targets 100 and cells 110 are configured to be robust with respect to printability, highly sensitive to changes in parameters of interest of printing tool 90 (e.g., focus) and enable using a simple calibration model—for example, one which reduces correlation between the target's response to focus and to dose, e.g., targets 100 may be configured to measure only focus parameters, independently of dose parameters (or vice versa). In certain embodiments, targets 100 may further be configured to enable cleaning out the impact of scanner aberrations, e.g., by having a 180° rotational symmetry. In certain embodiments, the impact of scanner aberrations may be cleaned out using a calibration procedure with the FEM wafer. Advantageously, targets 100 and cells 110 are designed to be measurable by a standard imaging OVL tool, e.g., a scatterometry overlay metrology tool.

Advantageously, cells 110 and targets 100 are designed to have at least two pitches, namely a fine pitch which is unresolved by measurement tool 95 and a coarse pitch which is resolved by measurement tool 95 and is equal to an integer number of fine pitches.

Figure 5:
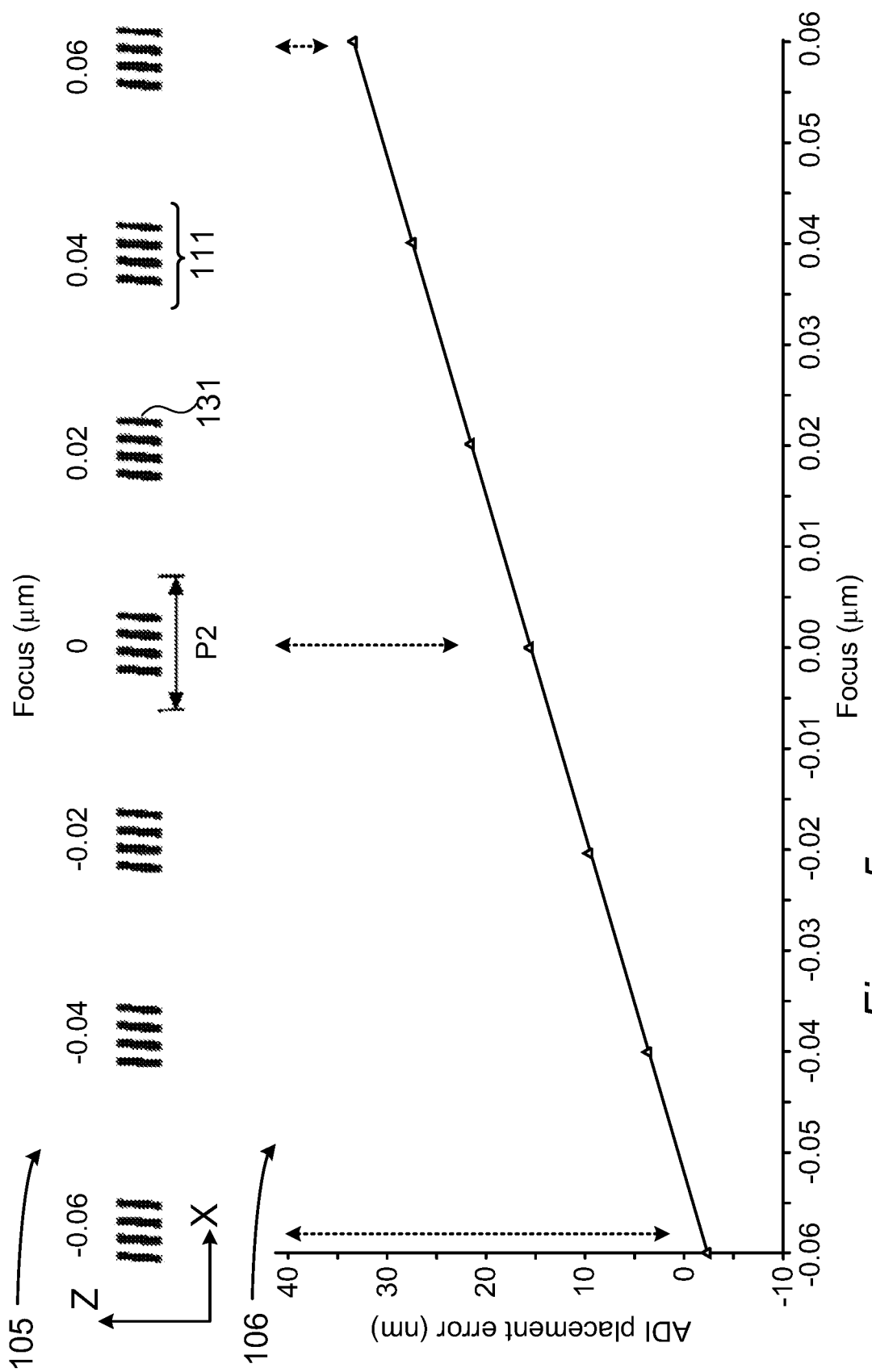
FIG. 5 illustrates schematically the lateral shifts of lines in printed cells in dependence of the focus shifts of printing tool, in a non-limiting example according to some embodiments of the invention.

FIG. 5 illustrates schematically the lateral shifts of lines 131 in printed cells 111 in dependence of the focus shifts of printing tool 90 (e.g., a scanner), in a non-limiting example according to some embodiments of the invention. Printed target pattern 105 is illustrated similarly to FIG. 3, and is aligned with a graph 106 depicting the lateral shifts in terms of ADI (after-develop-inspection) placement errors in dependence of the scanner focus positions between −0.06 µm and +0.06 µm at 20 nm steps.

As illustrated in FIG. 5, the lateral shifts are almost linear with the scanner focus change, and provide ca. 35 nm of lateral shift for the 120 nm scanner focus interval. This measurement budget is comparable to typical overlay measurement budgets, and as the measurement methods are similar, allows estimating the focus measurement accuracy. For example, typically overlay measurements between two target cells with opposite asymmetry directions provide 70 nm overlay change for 120 nm scanner focus interval. Assuming overlay measurement accuracy of ca. 1 nm, the accuracy for the disclosed measurements of focus shifts using the lateral shifts of printed cells 110 may be estimated as about double, e.g., 2-3 nm for scanner focus metrology.

Figure 6:
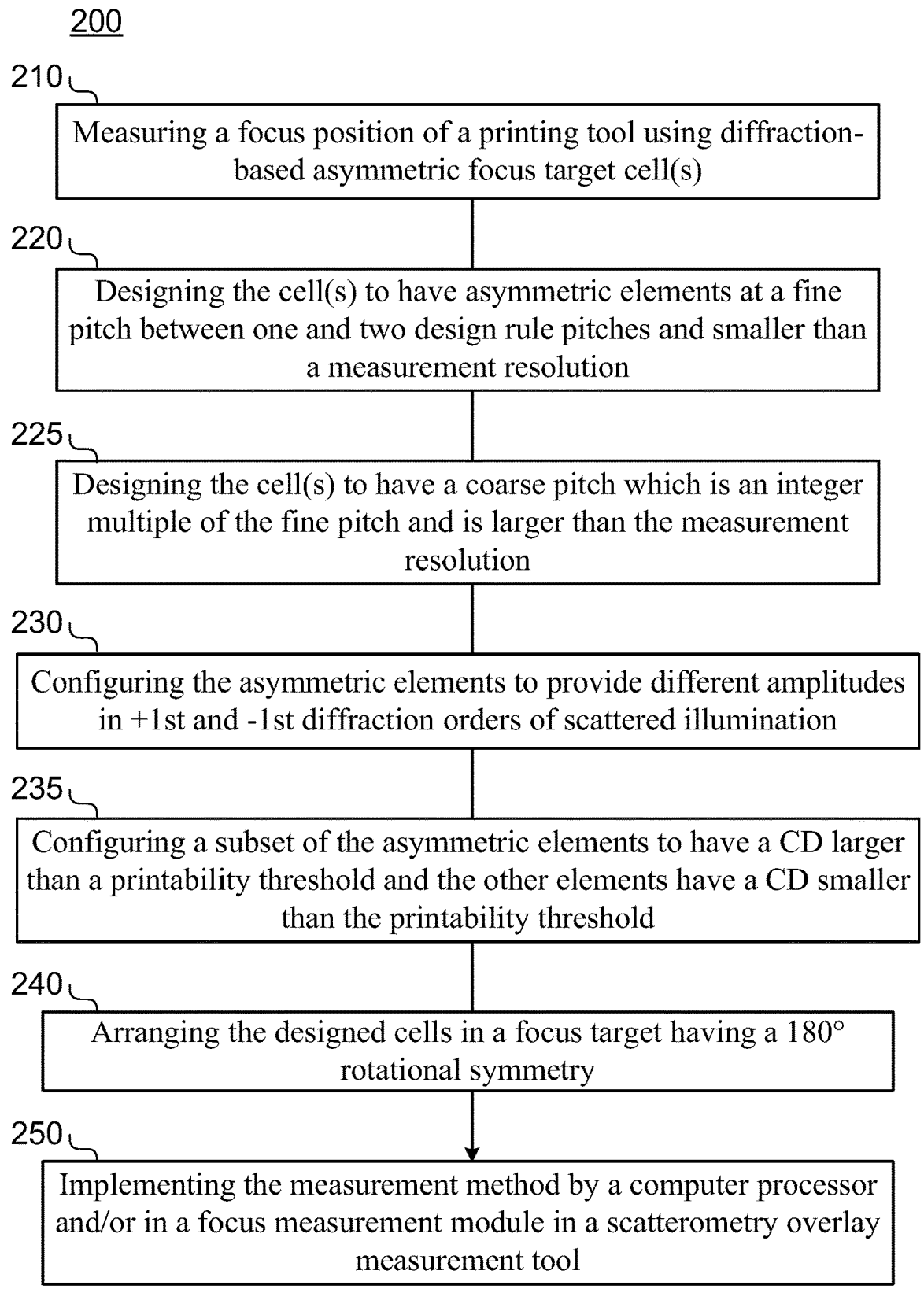
FIG. 6 is a high level flowchart illustrating a method, according to some embodiments of the invention.

FIG. 6 is a high level flowchart illustrating a method 200, according to some embodiments of the invention. The method stages may be carried out with respect to targets 100, cells 110 and/or measurement tool 95 described above, which may optionally be configured to implement method 200. Method 200 may be at least partially implemented by at least one computer processor and/or in a focus measurement module, possibly in a scatterometry overlay measurement tool. Certain embodiments comprise computer program products comprising a computer readable storage medium having computer readable program embodied therewith and configured to carry out the relevant stages of method 200. Certain embodiments comprise target design files of respective targets designed by embodiments of method 200. Method 200 may comprise the following stages, irrespective of their order.

Method 200 may comprise measuring a focus position of a printing tool using at least one diffraction-based focus target cell (stage 210) having asymmetric elements arranged at a fine pitch between one and two design rule pitches and smaller than a measurement resolution, the at least one cell having a coarse pitch which is an integer multiple of the fine pitch and is larger than the measurement resolution, wherein the asymmetric elements are designed to provide different amplitudes in $+1^{st}$ and $-1^{st}$ diffraction orders of scattered illumination and wherein a subset of the elements has a CD larger than a printability threshold and the other elements have a CD smaller than the printability threshold. In certain embodiments, the cells may be arranged in a focus target having a 180° rotational symmetry.

Method 200 may comprise designing a diffraction-based focus target by designing diffraction-based focus target cells to have asymmetric elements arranged at a fine pitch between one and two design rule pitches and smaller than a measurement resolution (stage 220) and to have a coarse pitch which is an integer multiple of the fine pitch and is larger than the measurement resolution (stage 225). Method 200 may further comprise configuring the asymmetric elements to provide different amplitudes in $+1^{st}$ and $-1^{st}$ diffraction orders of scattered illumination (stage 230) and configuring a subset of the elements has a CD larger than a printability threshold and the other elements have a CD smaller than the printability threshold (stage 235). Method 200 may further comprise arranging the designed cells in a focus target having a 180° rotational symmetry (stage 240).

Advantageously, disclosed targets 100, cells 110, measurement tools 95 and/or methods 200 are sensitive to scanner focus position targets, provide simple calibration procedures allowing cleaning out the effect of scanner aberrations and enable transforming information about scanner focus position into the lateral shift of the printed pattern without changing the form of the printed pattern.

Advantageously, disclosed targets 100, cells 110, measurement tools 95 and/or methods 200 provide much higher target sensitivity, measurement accuracy for current and smaller nodes, as measurement is carried out around the nominal focus position within the process window and with designs which are printable across the process window, while several prior art methods have a very lower sensitivity around the nominal focus position (which is the range of interest) and/or exhibit coupling between scanner focus and dose parameters which prevent separation thereof (e.g., methods (i) and (ii) in the background section). Some of the prior art methods require expensive test masks which are currently inapplicable (e.g., method (iii) in the background section), while disclosed targets 100 and cells 110 provide straightforward designs. Some of the prior art methods (e.g., method (iv) in the background section) use large pitches which are resolved by measurement tool 95 but provide therefore several diffraction orders (typically 5-6 orders with more or less the same amplitude), each having a phase which changes with scanner focus change and causing different changes of the pattern profiles, in additional to the shifts—and are characterized by difficult printability of the targets and low accuracy of the calibration model.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A diffraction-based focus target cell, printable using a lithographic printing tool, comprising a periodic structure having a coarse pitch and a plurality of elements arranged at a fine pitch, wherein the coarse pitch is an integer multiple of the fine pitch, with the fine pitch being between one and two integer multiples of a design-rule pitch and smaller than a measurement resolution and the coarse pitch being larger than the measurement resolution, wherein the measurement resolution is a resolution of a measurement tool,
   wherein the elements are asymmetric to provide different amplitudes in $+1^{st}$ and $-1^{st}$ diffraction orders of scattered illumination,
   wherein the design-rule pitch is a smallest pitch printable by the lithographic printing tool, and
   wherein a subset of the elements has a CD (critical dimension) larger than the design-rule pitch and the other elements have a CD smaller than the design-rule pitch.

2. The diffraction-based focus target cell of claim 1, further comprising lines having a CD smaller than the design-rule pitch, the lines delimiting the elements arranged at the fine pitch.

3. A diffraction-based focus target comprising a plurality of the diffraction-based focus target cells of claim 1, having at least two pairs of cells with opposite asymmetry of the elements, and wherein the target has a 180° rotational symmetry.

4. A target design file of the target of claim 3.

5. A method comprising measuring a focus position of a printing tool using at least one diffraction-based focus target cell of claim 1.

6. A method comprising:
   measuring a focus position of a printing tool using at least one diffraction-based focus target cell, printable using a lithographic printing tool, having asymmetric elements arranged at a fine pitch between one and two integer multiples of a design-rule pitch and smaller than a measurement resolution, the at least one cell having a coarse pitch which is an integer multiple of the fine pitch and is larger than the measurement resolution, wherein the measurement resolution is a resolution of a measurement tool,
   wherein the design-rule pitch is a smallest pitch printable by the lithographic printing tool, and
   wherein the asymmetric elements are designed to provide different amplitudes in $+1^{st}$ and $-1^{st}$ diffraction orders of scattered illumination and wherein a subset of the elements has a CD larger than the design-rule pitch and the other elements have a CD smaller than the design-rule pitch.

7. The method of claim 6, wherein the cells are arranged in a focus target having a 180° rotational symmetry.

8. A computer program product comprising a non-transitory computer readable storage medium having computer readable program embodied therewith, the computer readable program configured to implement the method of claim 6.

9. A scatterometry overlay measurement tool comprising a focus module configured to implement the method of claim 6.

10. A method comprising designing a diffraction-based focus target by:

designing diffraction-based focus target cells, printable using a lithographic printing tool, to have asymmetric elements arranged at a fine pitch between one and two integer multiples of a design-rule pitch, wherein the design-rule pitch is a smallest pitch printable by the lithographic printing tool, and smaller than a measurement resolution, the at least one cell having a coarse pitch which is an integer multiple of the fine pitch and is larger than the measurement resolution, wherein the measurement resolution is a resolution of a measurement tool, configuring the asymmetric elements to provide different amplitudes in $+1^{st}$ and $-1^{st}$ diffraction orders of scattered illumination, wherein a subset of the elements has a CD larger than the design-rule pitch and the other elements have a CD smaller than the design-rule pitch, and arranging the designed cells in a focus target having a 180° rotational symmetry.

11. A diffraction-based focus target comprising a plurality of the diffraction-based focus target cells of claim 2, having at least two pairs of cells with opposite asymmetry of the elements, and wherein the target has a 180° rotational symmetry.

12. A target design file of the target of claim 11.

13. A method comprising measuring a focus position of a printing tool using at least one diffraction-based focus target cell of claim 2.

* * * * *